(12) United States Patent
Shima et al.

(10) Patent No.: US 6,642,534 B2
(45) Date of Patent: Nov. 4, 2003

(54) X-RAY DETECTION PLATE AND X-RAY DETECTOR

(75) Inventors: Kazuhiko Shima, Kofu (JP); Masahito Sato, Kofu (JP); Naoki Uchida, Kofu (JP); Yoichiro Shimura, Kofu (JP); Kenji Sato, Otsu (JP); Hidetoshi Kishimoto, Izumi (JP)

(73) Assignees: Shindengen Electric Manufacturing Co., Ltd., Tokyo (JP); Yamanashi Electronics Co., Ltd., Kofu (JP); Shimadzu Corporation, Kyoto (JP)

( * ) Notice: Subject to any disclaimer, the term of this patent is extended or adjusted under 35 U.S.C. 154(b) by 121 days.

(21) Appl. No.: 09/814,831

(22) Filed: Mar. 23, 2001

(65) Prior Publication Data
US 2001/0032942 A1 Oct. 25, 2001

(30) Foreign Application Priority Data
Mar. 29, 2000 (JP) ........................................ 2000-090992

(51) Int. Cl.[7] ................................................ G21K 4/00
(52) U.S. Cl. .................... 250/580; 250/370.09; 250/591
(58) Field of Search ........................... 250/580, 370.09, 250/591

(56) References Cited

U.S. PATENT DOCUMENTS

| | | | | |
|---|---|---|---|---|
| 4,429,325 A | * | 1/1984 | Takasaki et al. | 257/444 |
| 4,614,891 A | * | 9/1986 | Kuwahata et al. | 313/386 |
| 5,598,004 A | * | 1/1997 | Powell et al. | 250/370.09 |
| 6,353,229 B1 | * | 3/2002 | Polischuk et al. | 250/370.14 |
| 6,407,374 B1 | * | 6/2002 | Sato et al. | 250/208.1 |

FOREIGN PATENT DOCUMENTS

| | | | | | |
|---|---|---|---|---|---|
| JP | 53035420 A | * | 4/1978 | ............ | H01J/29/45 |
| JP | 56146143 A | * | 11/1981 | ............ | G03G/5/08 |
| JP | 57000833 A | * | 1/1982 | ............ | H01J/29/45 |
| JP | 2000-230981 A | | 8/2000 | | |

* cited by examiner

Primary Examiner—David Porta
Assistant Examiner—Christine Sung
(74) Attorney, Agent, or Firm—Oliff & Berridge, PLC

(57) ABSTRACT

It is an object of the invention to improve the quality of images obtained by an X-ray detector.

A charge transport layer 13 mainly consisted of diantimony trisulfide, an X-ray detection layer 14 mainly consisted of amorphous selenium and a second electrode film 15 are formed in the same order on the surface of a first electrode film 12 provided on a substrate 11. A voltage whose polarity is positive at the first electrode film 12 and negative at the second electrode film 15 is applied, and the surface of the second electrode film 15 is irradiated with an X-ray. Then, carriers generated in the X-ray detection layer 14 are collected by the first and second electrode films. Since a diode whose anode is an X-ray detection layer 14 side and whose cathode is a charge transport layer 13 side is formed at the interface between the X-ray detection layer 14 and charge transport layer 13 of the X-ray detector 31, no hole is injected from the first electrode film 12 into the X-ray detection layer 14, which prevents any reduction of image quality.

20 Claims, 10 Drawing Sheets

31

X-RAY DETECTION PLATE AND X-RAY DETECTOR

BACKGROUND OF THE INVENTION

1. Field of the Invention

The present invention relates to X-ray detectors and, more particularly, to the technical field of X-ray detectors utilizing selenium (Se).

2. Description of the Related Art

X-ray detectors utilizing radioactive rays such as X-rays and X-rays are recently playing a role of increasing importance in a wide range of medical and industrial applications. In the medical field of application, X-ray CT is a typical example of the use of digital images in diagnosis. Transition from analog photography to digital photography is represented by DSA (Digital Signature Algorithm), and CR(DR)s for general simple photography for which a great amount of demand exists. Digital ultrasonic apparatuses have recently been actively developed, too. The digitalization in almost all fields of imaging technology is supported by the fact that image quality of analog photography has now become available on a digital basis, reductions in the prices of photographic apparatuses and various advantages provided by the use of image preservation and transfer systems.

Above all, there is a great demand in the market for methods for recording and reading X-ray images because of many advantages expected from such methods including utilization of digitized image information for general purposes, improvement of diagnostic efficiency and quality, and cost reduction achieved by connection of an image network.

X-ray images are recorded and detected using silver-salt films, organic polymer films or accelerated phosphorescence films and semiconductor devices. However, the above-described market demand for digitalization is still unsatisfied, for example, in that an accelerated phosphorescent element does not allow real time image processing because of a time lag in image processing attributable to the fact that the element utilizes the phenomenon of temporarily accumulating X-ray energy and emitting fluorescent light when irradiated by visible light.

In order to solve such a problem, development efforts have been put on image processing systems utilizing X-ray image sensors represented by direct conversion type devices on TFT (thin film transistor) panels, image processing systems utilizing an indirect type image reading sensor comprising a scanning laser and an LED, and the like. The development is also active on utilization of unique characteristics of amorphous Se which is a light-receiving element for X-ray image sensors.

A common technique for forming Se films is vacuum deposition which has been established as a technique for forming thin films. An X-ray detection plate which is a detecting unit of an X-ray detector must satisfy functional requirements in that the quantity of a current (charge) that flows when it is not irradiated by an X-ray should be small; the quantity of a current (charge) when irradiated by an X-ray should be great; response at switching between non-irradiated and irradiated states should be high; and fluctuations of charge as a result of repeated use should be small. In particular, an essential requirement for an X-ray image detector is high resolution.

It is an object of the invention to improve the performance of X-ray detection plates used in X-ray detectors as described above, especially X-ray detection plates utilizing amorphous Se and X-ray detectors utilizing such X-ray detection plates. Various structures have been conceived for conventional X-ray detection plates utilizing amorphous Se with a primary intention of increasing the quantity of a current that flows, i.e., sensitivity when irradiated by an X-ray. Although sensitivity is increased, the quantity of a current (charge) that flows when a detection plate is not irradiated with an X-ray, i.e., a dark noise, increases, and a reduction in resolution occurs in the case of a two-dimensional X-ray detector. In practice, no X-ray detection plate has been provided which satisfies all requirements.

SUMMARY OF THE INVENTION

A first X-ray detection plate according to the invention is an X-ray detection plate having an insulating substrate, a first electrode film formed on the substrate, a charge transport layer formed on the first electrode film, an X-ray detection layer mainly consisting of amorphous selenium and formed in contact with the charge transport layer and a second electrode film formed on the X-ray detection layer, the charge transport layer being a semi-insulating resistive element having specific resistance between $10^6$ Ωcm and $10^{12}$ Ωcm inclusive, the junction between the charge transport layer and the X-ray detection layer having characteristics of a diode whose cathode is the charge transport layer side and whose anode is the X-ray detection layer side.

A second X-ray detection plate according to the invention is an X-ray detection plate having an insulating substrate, a plurality of charge storage elements formed on the insulating substrate, a plurality of first electrode films formed on the plurality of charge storage elements and electrically connected to the plurality of charge storage elements respectively, a charge transport layer formed on the first electrode films, an X-ray detection layer mainly consisted of amorphous selenium and formed in contact with the charge transport layer and a second electrode film formed on the X-ray detection layer, the X-ray detection plate having means for sequentially reading charge signals stored in the plurality of charge storage elements according to a time series, the charge transport layer being a semi-insulating resistive element having specific resistance between $10^6$ Ωcm and $10^{12}$ Ωcm inclusive.

The second X-ray detection plate may be an X-ray detection plate in which the junction between the charge transport layer and the X-ray detection layer has characteristics of a diode whose cathode is the charge transport layer side and whose anode is the X-ray detection layer side.

The first and/or second X-ray detection plate according to the invention may be an X-ray detection plate in which the thickness of the charge transport layer is between 0.01 μm and 50 μm inclusive and in which the selenium content of the X-ray detection layer is 90 weight % or more.

The first and/or second X-ray detection plate according to the invention may be an X-ray detection plate in which the charge transport layer is a semi-insulating resistive element mainly consisted of diantimony trisulfide ($Sb_2S_3$).

The first and/or second X-ray detection plate according to the invention may be an X-ray detection plate in which the second electrode film is a metal film mainly consisted of gold.

The first and/or second X-ray detection plate according to the invention may be an X-ray detection plate in which the first electrode film have transparency.

The first and/or second X-ray detection plate according to the invention may be an X-ray detection plate in which an ITO (indium tin oxide) film is used as the first electrode film having transparency.

The first and/or second X-ray detection plate according to the invention may be an X-ray detection plate in which the substrate have transparency when the first electrode film have transparency.

A first X-ray detector according to the invention comprising an X-ray detection plate, a power supply and an X-ray irradiator, wherein the power supply supplies a voltage to the X-ray detection plate and the X-ray irradiator is caused to emit an X-ray such that the X-ray detection plate is irradiated with the X-ray which has been transmitted by an object to be measured to form an image on the X-ray detection plate, and the X-ray detection plate having an insulating substrate, a first electrode film formed on the substrate, a charge transport layer formed on the first electrode film, an X-ray detection layer mainly consisted of amorphous selenium and formed in contact with the charge transport layer and a second electrode film formed on the X-ray detection layer, the charge transport layer being a semi-insulating resistive element having specific resistance between $10^6$ $\Omega$cm and $10^{12}$ $\Omega$cm inclusive, the junction between the charge transport layer and the X-ray detection layer having characteristics of a diode whose cathode is the charge transport layer side and whose anode is the X-ray detection layer side, the power supply applying a voltage to the second electrode film during the irradiation with the X-ray, the voltage being lower than the voltage applied to the first electrode film.

A second X-ray detector according to the invention is an X-ray detector having an X-ray detection plate, a power supply and an X-ray irradiator, wherein the X-ray irradiator is caused to emit an X-ray while a voltage is applied to the X-ray detection plate by the power supply to form an image on the X-ray detection plate, and the X-ray detection plate having an insulating substrate, a plurality of charge storage elements formed on the insulating substrate, a plurality of first electrode films electrically connected to the plurality of charge storage elements respectively, a charge transport layer formed on the first electrode films, an X-ray detection layer mainly consisted of amorphous selenium and formed in contact with the charge transport layer and a second electrode film formed on the X-ray detection layer, wherein the X-ray detection plate has means for sequentially reading charge signals stored in the plurality of charge storage elements according to a time series and in which the charge transport layer is a semi-insulating resistive element having specific resistance between $10^6$ $\Omega$cm and $10^{12}$ $\Omega$cm inclusive, the power supply applying a voltage to the second electrode film during the irradiation with the X-ray, the voltage being lower than the voltage applied to the first electrode films.

The first and/or second X-ray detector according to the invention may be an X-ray detector having a display device for displaying the image formed on the X-ray detection plate.

DETAILED DESCRIPTION OF THE PREFERRED EMBODIMENTS

In order to improve performance such as the quantity of the current and response speed, the inventors of the present invention have studied techniques for optimizing the height of a barrier and the space-charges density by examining potentials dispersed between a first electrode film formed on a substrate and an X-ray detection layer mainly consisted of amorphous selenium, and potentials dispersed between a second electrode formed on the X-ray detection layer and the X-ray detection layer along with materials for the first electrode.

The inventors fabricated a two-dimensional X-ray detection plate comprising semi-insulating charge transport layers with different thicknesses, which are formed on a TFT panel having a plurality of capacitors, thin film transistors (TFTs) and first electrode films formed thereon, and an X-ray detection layer mainly consisted of amorphous selenium and a second electrode film formed in a two-dimensional matrix. The inventors compared the resolutions of X-ray images that depend on the thicknesses of the semi-insulating charge transport layers.

An embodiment of an X-ray detector according to the invention will be described first. For example, an X-ray detector is used in which ITO, diantimony trisulfide, amorphous selenium and gold are used on a glass substrate as a first electrode film, a charge transport layer, an X-ray detection layer and a second electrode film, respectively. However the present invention is not limited to this example.

Stainless steel boats respectively loaded with diantimony trisulfide, selenium and gold were placed in a vacuum chamber of a vacuum deposition apparatus. A substrate made of glass having a first electrode film made of ITO formed in advance was transported into the vacuum chamber. After evacuating the vacuum chamber to a predetermined pressure, the diantimony trisulfide was heated with a resistance heating element to emit a vapor of diantimony trisulfide in the vacuum chamber, thereby forming a charge transport layer with a 3 μm thick diantimony trisulfide thin film.

The evaporation of diantimony trisulfide was then stopped, and selenium was similarly heated to emit a vapor of selenium in the vacuum chamber, thereby forming an X-ray detection layer with 500 μm thick amorphous selenium thin film on the surface of the charge transport layer.

The evaporation of selenium was then stopped, and gold was heated to emit a vapor of gold in the vacuum chamber, thereby forming a second electrode film with 0.1 μm thick gold film on the surface of the X-ray detection layer. The substrate was then removed from the vacuum chamber.

Figure 1:
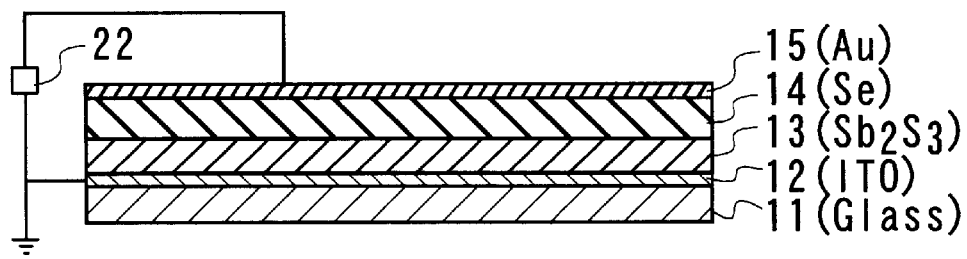
FIG. 1 shows an embodiment of an X-ray detection plate according to the invention.

Reference numeral 31 as shown in FIG. 1 represents an X-ray detection plate according to a first embodiment of the invention obtained through the above-described steps. A first electrode film 12, a charge transport layer 13, an X-ray detection layer 14 and a second electrode film 15 are formed in the same order on a substrate 11.

Figure 3:
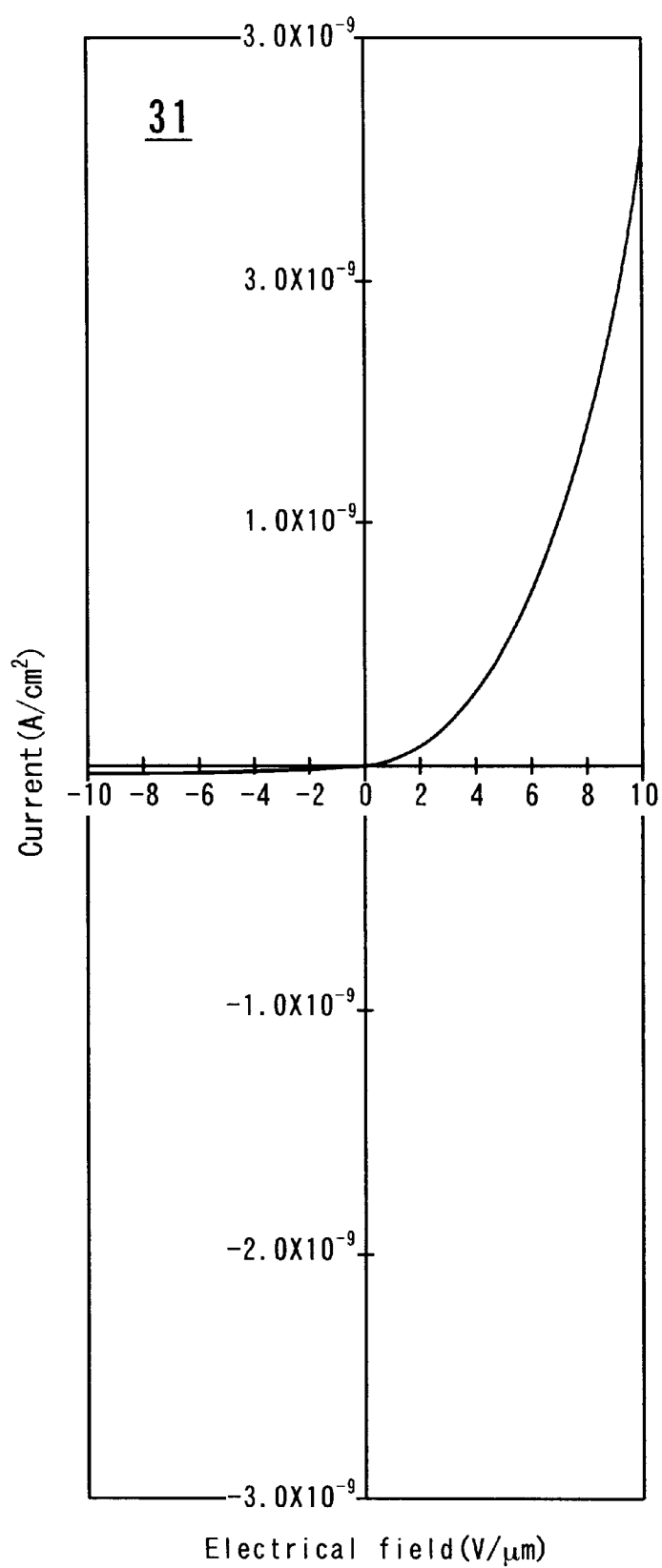
FIG. 3 is a graph showing electrical characteristics of the X-ray detection plate according to the invention.

A power supply 20 was connected between the first electrode film 12 and second electrode film 15 of the X-ray detector 31 to apply a voltage, thereby measuring electrical characteristics of the same. FIG. 3 shows the result of the measurement. It would be understood that no current flows when a negative voltage is applied to the second electrode film and that a current flows when a positive voltage is applied.

For the purpose of comparison, an X-ray detection plate 32 having a structure as shown in FIG. 2s was fabricated by forming an X-ray detection layer 14 made of amorphous selenium directly on the surface of a first electrode film 12 made of ITO and forming a second electrode film 15 consisted of a gold film directly on the surface of the X-ray detection layer 14. The X-ray detection plate 32 has no charge transport layer.

Figure 4:
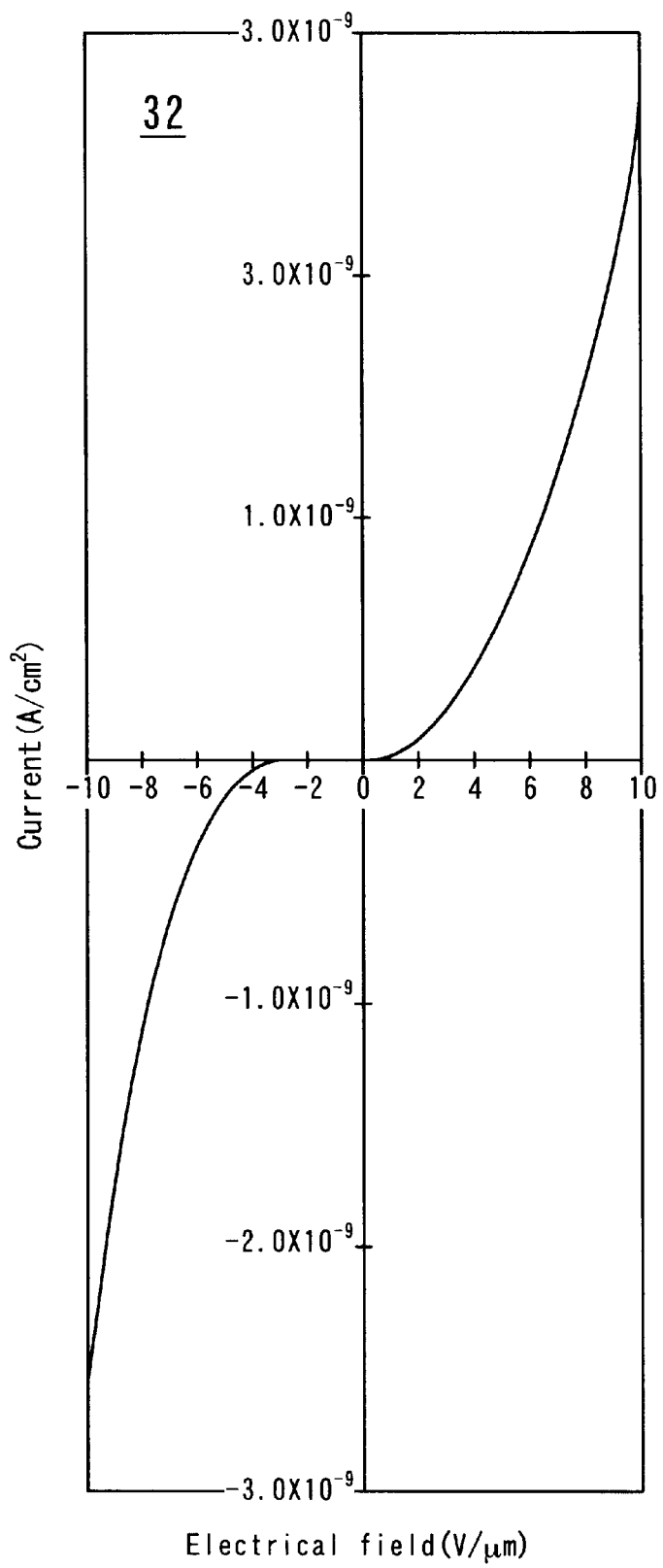
FIG. 4 is a graph showing electrical characteristics of an X-ray detection plate as a comparative example.

A measurement of the electrical characteristics of the element 32 indicated that a current flows in both positive and negative directions as shown in FIG. 4. Based on the waveform of the current, the X-ray detection plate 32 shown in FIG. 2a can be represented by an equivalent circuit in which two diodes 41 and 42 are inverse-parallel connected as shown in FIG. 7b. The inverse-parallel connected circuit of the diodes 41 and 42 is regarded as physical properties of amorphous selenium.

Figure 2A:
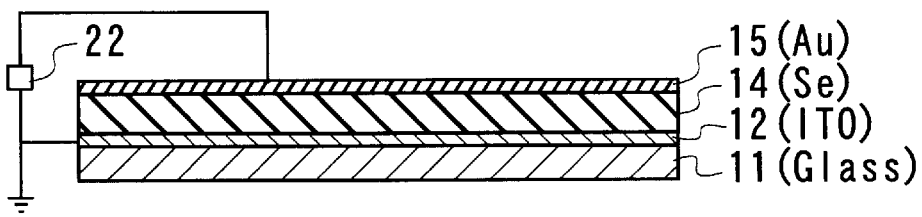
FIGS. 2A, 2B and 2C show X-ray detection plates as comparative examples.
Figure 2B:
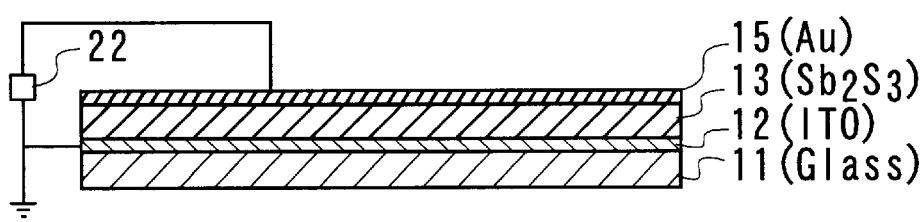

Then, a first electrode film 12 made of ITO, a charge transport layer 13 mainly consisted of diantimony trisulfide and a second electrode film 15 consisted of a gold thin film were formed in the same order on a substrate 11 made of glass to fabricate an X-ray detection plate 33 having no X-ray detection layer as shown in FIG. 2b.

Figure 5:
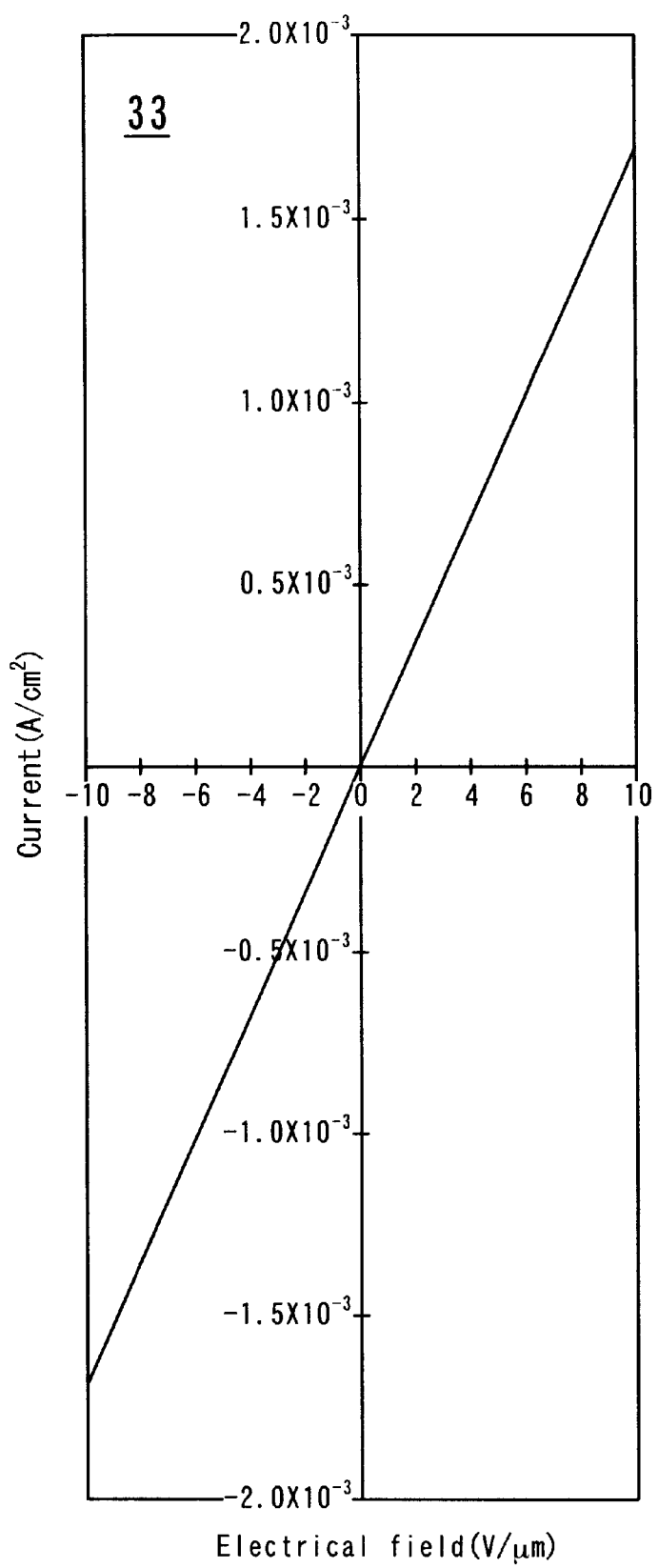
FIG. 5 is a graph showing electrical characteristics of an X-ray detection plate as another comparative example.

A measurement of the electrical characteristics of the X-ray detection plate 33 indicated resistive characteristics as shown in FIG. 5. The specific resistance was $10^8$ Ωcm. Therefore, an equivalent circuit of the X-ray detection plate 33 shown in FIG. 2b can be represented by a resistive component 44 as shown in FIG. 7c. The resistive component 44 is regarded as physical properties of diantimony trisulfide layer.

The X-ray detection plate 31 according to the first embodiment has the inverse-parallel connected circuit of diodes 41 and 42 shown in FIG. 7b and the resistive component 44 shown in FIG. 7C because it has the X-ray detection layer 14 made of amorphous selenium and the charge transport layer 13 mainly consisted of diantimony trisulfide which are stacked on one another.

Figure 7A:
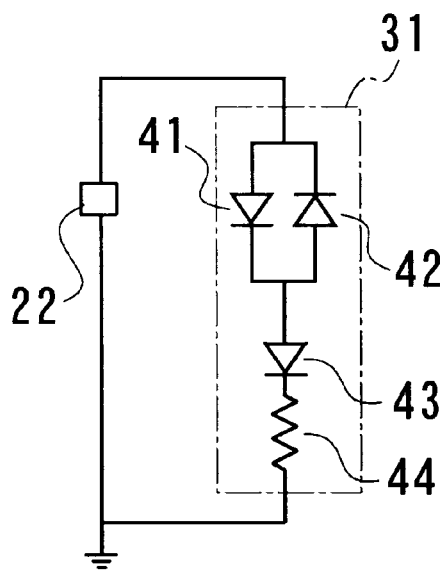
FIGS. 7A, 7B, 7C and 7D shows equivalent circuits of the X-ray detection plate according to the invention and the X-ray detection plates as comparative examples.
Figure 7B:
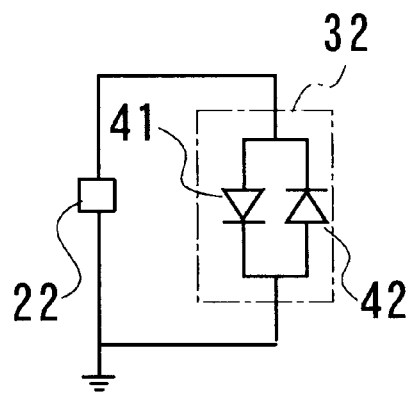
Figure 7C:
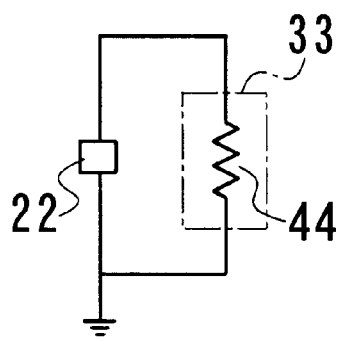

Further, since the X-ray detection plate 31 according to the first embodiment as a whole exhibits diode characteristics as shown in FIG. 3, the X-ray detection plate 31 consequently has an equivalent circuit in which a inverse-parallel connected circuit of diodes 41 and 42, a resistive component 44 and a reverse-blocking diode 43 are connected in series as shown in FIG. 7a.

The anode of the reverse-blocking diode 43 faces the second electrode film 15, and the cathode of the same faces the first electrode film.

A comparison between the structure of the X-ray detection plate 31 according to the first embodiment and the structures of the X-ray detection plates 32 and 33 shown in FIGS. 2A and 2B indicates that the reverse-blocking diode 43 represents the electrical characteristics of the interface between the X-ray detection layer 14 and charge transport layer 13.

Figure 2C:
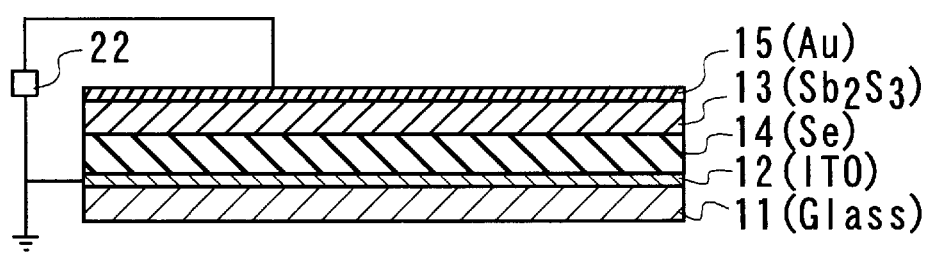
Figure 6:
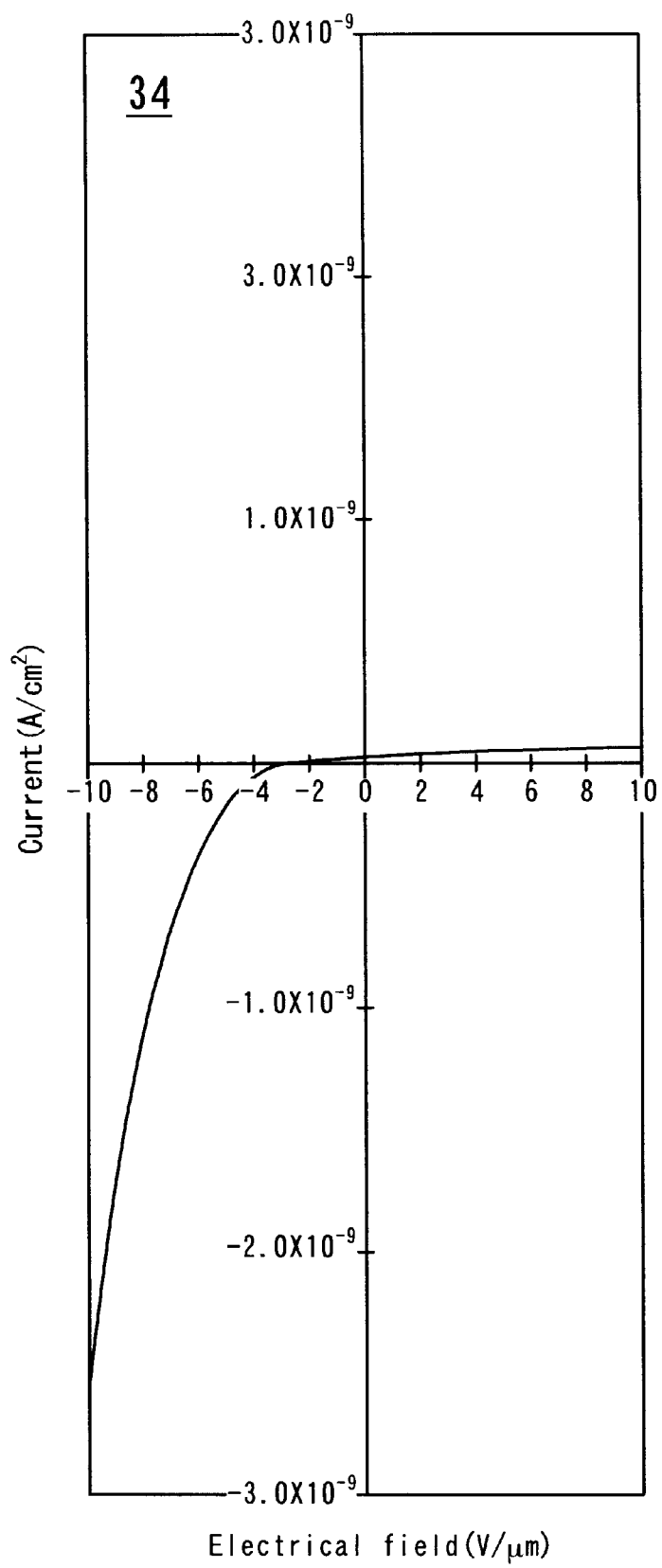
FIG. 6 is a graph showing electrical characteristics of an X-ray detection plate as still another comparative example.
Figure 7D:
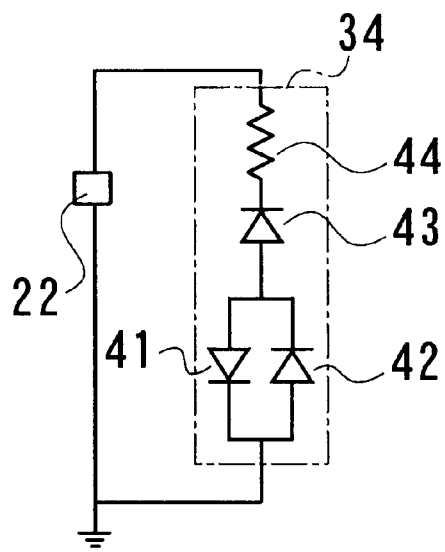

For the purpose of comparison, an X-ray detection layer 14 consisted of amorphous selenium was formed on a first electrode film 12 made of ITO, and a charge transport layer 13 mainly consisted of diantimony trisulfide was formed on the surface thereof, and a second electrode film 15 consisted of a gold thin film was formed on the surface of the charge transport layer 13 to fabricate an X-ray detection plate 34 as shown in FIG. 2c. The electrical characteristics of the X-ray detection plate 34 having such a structure are diode characteristics as shown in FIG. 6. However, the current flows in the direction opposite to that of the X-ray detection plate 31 according to the invention because the X-ray detection layer 14 and charge transport layer 13 are formed in the reverse order. FIG. 7d shows an equivalent circuit of the X-ray detection plate 34.

Figure 9:
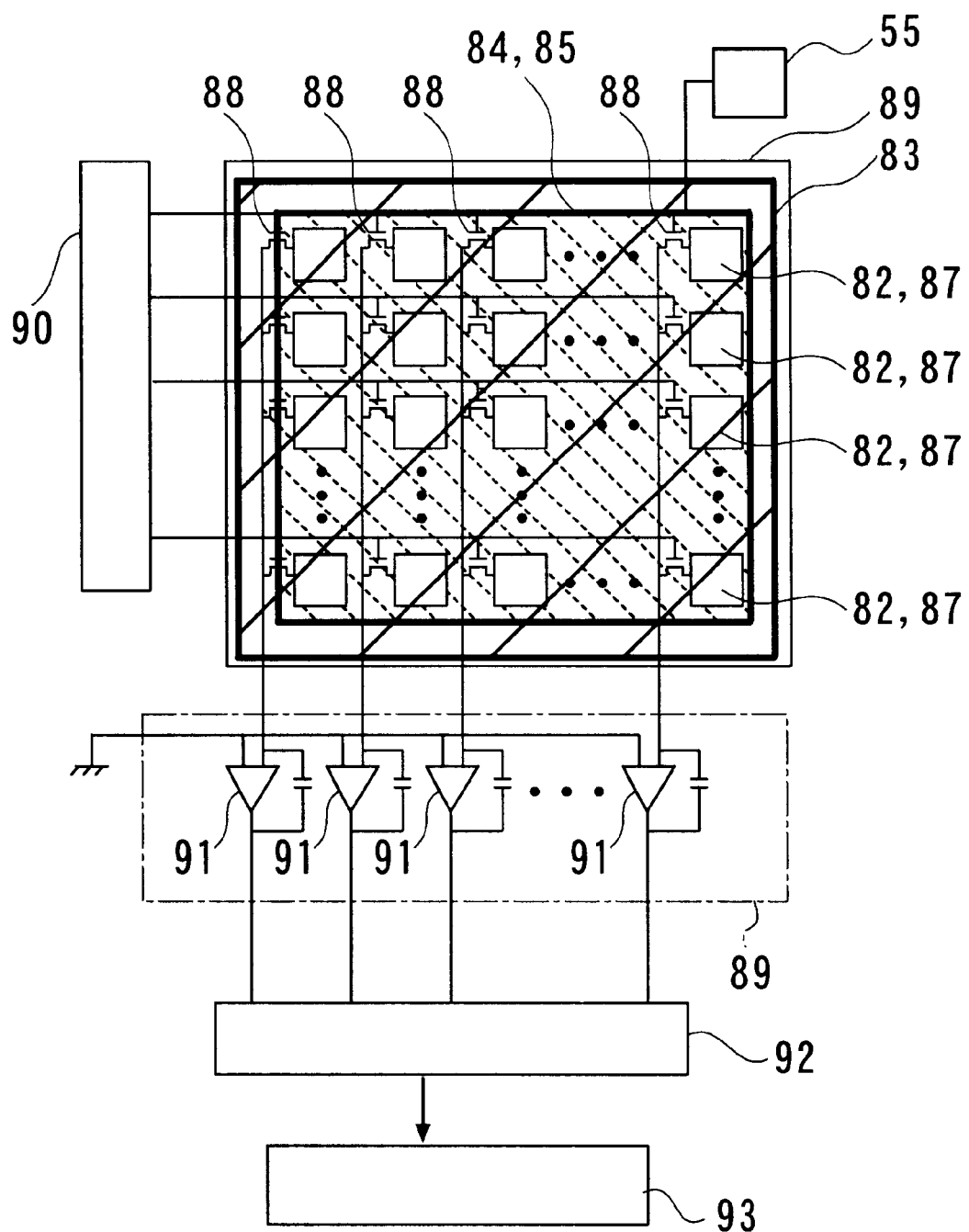
FIG. 9 is a schematic illustration of an operation of the two-dimensional X-ray detector according to the invention.

An X-ray detector according to the invention will now be described. Reference numeral 57 in FIG. 9 represents an embodiment of an X-ray detector according to the invention.

Figure 8:
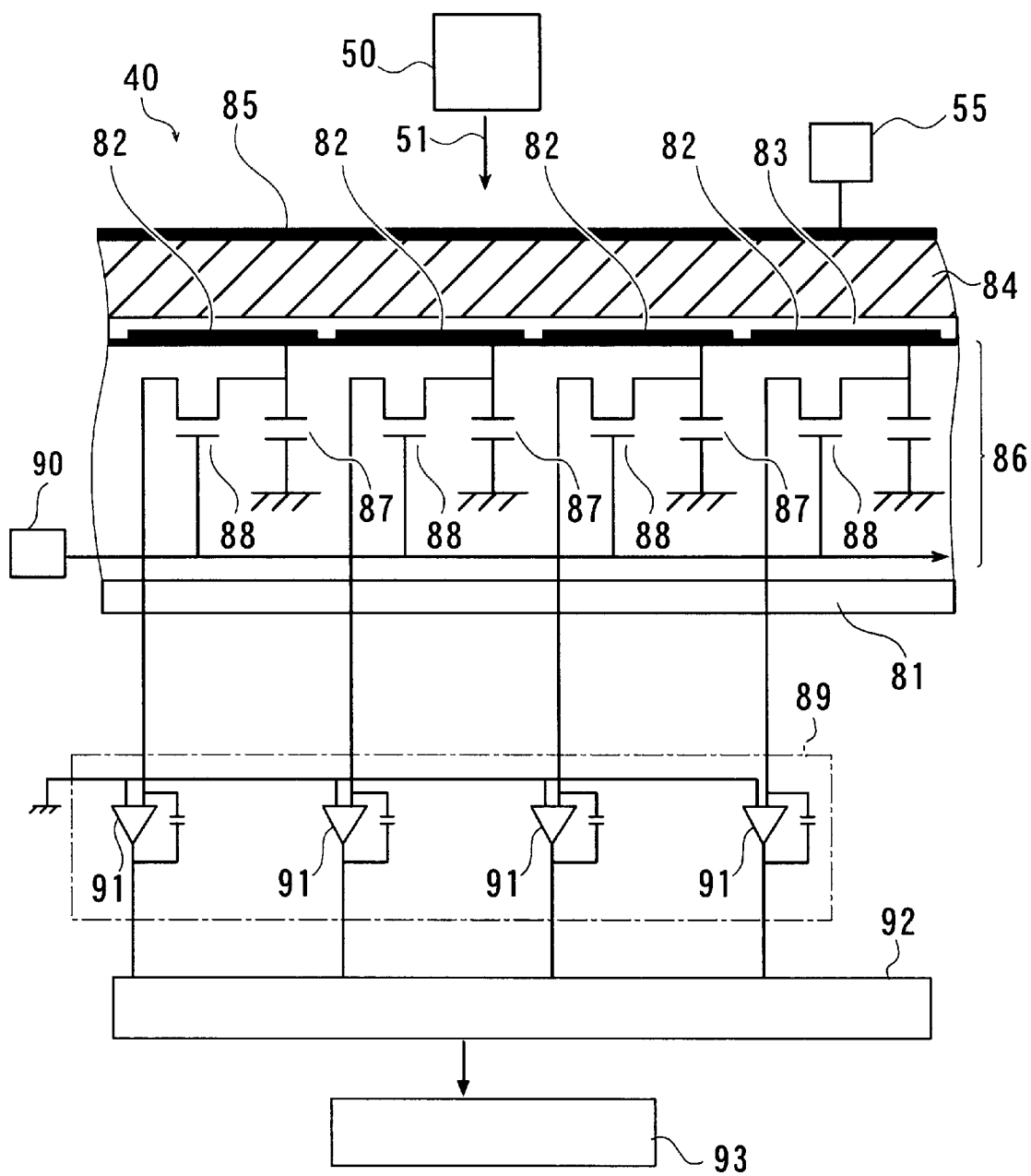
FIG. 8 is a schematic sectional view of a two-dimensional X-ray detector according to the invention.

The X-ray detector 57 has an X-ray detection plate 40 which is an embodiment of the invention. FIG. 8 shows a sectional view of the X-ray detection plate 40.

The X-ray detection plate 40 has an insulating substrate 81, and a plurality of charge storage elements 86 comprising a plurality of capacitors 87 and a plurality of thin film transistors (TFTs) 88 are formed on the insulating substrate 81.

A plurality of first electrode films 82 are formed on the charge storage elements 86. The first electrode films 82 are electrically connected to the plurality of capacitors 87 respectively.

The first electrode films 82 are insulated from each other, and a charge transport layer 83 consisted of an diantimony trisulfide thin film is formed on the surface thereof.

An X-ray detection layer 84 consisted of an amorphous selenium thin film is formed on the charge transport layer 83, and a second electrode film 85 mainly consisted of gold is further formed on the surface of the X-ray detection layer 84. The charge transport layer 83 may be made of a substance other than diantimony trisulfide provided that it is a semi-insulating resistor whose specific resistance is between $10^6$ Ωcm and $10^{12}$ Ωcm inclusive.

Figure 10:
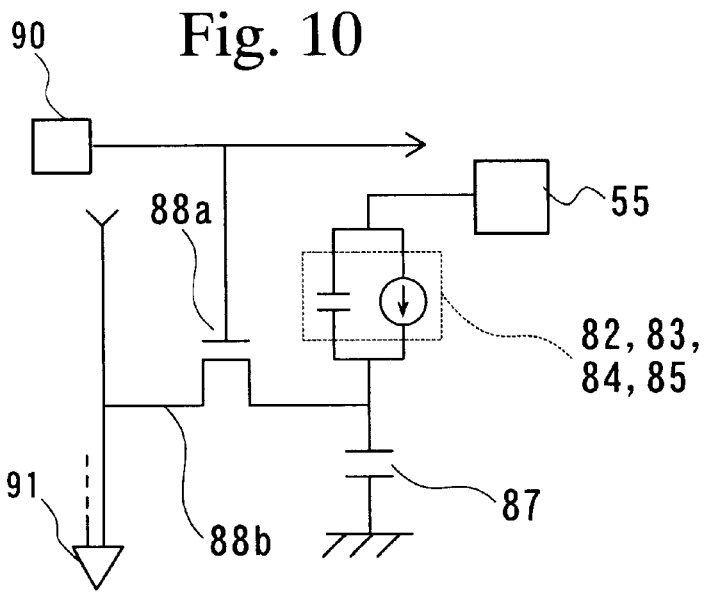
FIG. 10 shows an equivalent circuit of a charge storage element of the two-dimensional X-ray detector according to the invention.

FIG. 10 is an equivalent circuit diagram of the charge storage elements 86.

The X-ray detector 57 according to the invention has a power supply 55, an X-ray irradiator 50 and a gate driver 90. The thin film transistors 88 is turned off by the gate driver 90, and an X-ray 5a is radiated by the X-ray irradiator 50 while a negative voltage applied to the second electrode film 85 by the power supply 55. When the second electrode film 85 is irradiated by the X-ray which has been transmitted by an object to be measured, signal charges in accordance with the object to be measured are generated in the X-ray detection layer 84. The signal charges are consisted of holes which are positive charges and electrons which are negative charges.

A bias electrical field inclined in the direction of the thickness of the X-ray detection layer 84 is formed between the first electrode films 82 and the second electrode film 85 by the voltage applied by the power supply 55, and the signal charges generated in the X-ray detection layer 84 are moved by the bias electrical field toward the first electrode films 82 and the second electrode film 85 according to their polarities.

The capacitors 87 are connected to the respective first electrode films 82 at one end thereof and are connected to a ground potential at the other end thereof. Since the thin film transistors 88 are off, the capacitors 87 are charged by a current that have flown as a result of the movement of the signal charges.

The X-ray detector 57 according to the invention has a charge-to-voltage conversion circuit 89 and a display device 93. When the thin film transistors 88 are turned on by the gate driver 90, the high voltage ends of the capacitors 87 are connected to the charge-to-voltage conversion circuit 89, and the charge-to-voltage conversion circuit 89 converts the charges into voltage signals which are displayed on the display device 93.

FIG. 9 is a schematic illustration of a configuration of the X-ray detector 57 shown in FIG. 8. The gate terminals of the thin film transistors 88 provided at each pixel on a row of the matrix are commonly connected to the gate driver 90. Amplifier circuits 91 are provided in the charge-to-voltage conversion circuit 89 in the same quantity as the plurality of rows of the matrix, and the drain terminals of the thin film transistors 88 on each column of the matrix are connected to the respective amplifier circuit 91. A signal charge input to each amplifier circuit 91 is converted into a voltage and output by the amplifier circuit 91 to a multiplexer 92.

Signals output by the amplifier circuits 91 are sent by the multiplexer 92 to the image display device 93 pixel by pixel on each row and column at predetermined time intervals. An image enhancement circuit for image enhancement such as removal of noises is provided in the display device 93. The image enhancement circuit performs appropriate image processing, and the signals are reconstructed as a two-dimensional image which is in turn displayed on a display area of the display device 93.

Then, "dark current", "signal current", "fall time" and "rise time" were measured on the X-ray detection plate 31 according to the first embodiment. Conditions of measurement are following:

1. Dark Current

A negative current was applied to the second electrode film 15 to generate an electrical field of 10 V/$\mu$m in the X-ray detection plate 31, and a current obtained after leaving the plate in a dark place for ten minutes in such a state was measured as "a dark current". The dark current is preferably 100 pA/cm$^2$ or less.

2. Signal Current

After measuring the dark current, the second electrode film 15 was irradiated with an X-ray having a predetermined intensity from above with a negative voltage of the same magnitude as measurement of dark current applied thereto, and a current that flew through the X-ray detection plate 31 was measured when irradiated by the X-ray. The signal current is preferably 70 pA/cm$^2$ or more.

In order to stabilize the current, the current was measured when one minutes passed after the beginning of the irradiation with the X-ray, and the current was defined as "a signal current".

Referring to conditions for the irradiation with an X-ray at this time, the voltage applied to the X-ray tube was set at 80 kV, and the quantity of the X-ray directed to the X-ray detection plate 31 was set at 1.8 R/min.

3. Fall Time

When the irradiation with an X-ray is stopped after the measurement of the signal current, the current value decreases. The time spent before the current decreased to 10% of the dark current after the end of the irradiation with an X-ray was defined as "a fall time". The fall time is preferably 0.1 sec. or less.

4. Rise Time

When the signal current is measured by irradiating the plate with an X-ray after measuring the dark current, the current increases after the irradiation with an X-ray is started and stabilizes at a predetermined value (the magnitude of the signal current).

The time spent before the current increased to 90% of the signal current after the beginning of the irradiation with an X-ray was defined as "a rise time". The rise time is preferably 0.1 sec. or less.

The following table shows results of such measurement on the X-ray detection plate 31 according to the first embodiment and on second through seventh embodiments of the invention and first through fifth comparative examples.

TABLE 1

Measurement results

| | First electrode film Material | Charge transport layer | | | X-ray detection layer Thickness ($\mu$m) | Measurement resluts | | | |
|---|---|---|---|---|---|---|---|---|---|
| | | Material | Thickness ($\mu$m) | Specific resistance ($\Omega$ cm) | | Dark current (pA/cm$^2$) | Signal current (nA/cm$^2$) | Fall time (sec) | Rise time (sec) |
| Embodiment 1 | ITO | Sb$_2$S$_3$ | 3.0 | 10$^8$ | 500 | 10 | 80 | 0.05 | 0.05 |
| Embodiment 2 | Gold | Sb$_2$S$_3$ | 3.0 | 10$^8$ | 500 | 10 | 80 | 0.05 | 0.05 |
| Embodiment 3 | Alminum | Sb$_2$S$_3$ | 3.0 | 10$^8$ | 500 | 10 | 80 | 0.06 | 0.05 |
| Embodiment 4 | ITO | Sb$_2$S$_3$ | 3.0 | 10$^8$ | 1000 | 10 | 80 | 0.05 | 0.05 |
| Embodiment 5 | ITO | Sb$_2$S$_3$ | 0.01 | 10$^8$ | 500 | 50 | 80 | 0.05 | 0.05 |
| Embodiment 6 | ITO | Sb$_2$S$_3$ | 40.0 | 10$^8$ | 500 | 5 | 70 | 0.05 | 0.05 |
| Embodiment 7 | ITO | CdZnTe | 3.0 | 10$^{11}$ | 500 | 20 | 80 | 0.05 | 0.05 |
| Comparative example 1 | ITO | None | — | — | 500 | 2000 | 80 | 0.05 | 0.05 |
| Comparative example 2 | Gold | None | — | — | 500 | 5000 | 80 | 0.05 | 0.05 |
| Comparative example 3 | Alminum | None | — | — | 500 | 1000 | 80 | 0.05 | 0.05 |
| Comparative example 4 | ITO | CdS | 3.0 | 80 | 500 | 800 | 80 | 0.08 | 0.08 |
| Comparative example 5 | ITO | CeO$_2$ | 3.0 | 10$^5$ | 500 | 300 | 80 | 0.50 | 0.50 |

[Second Embodiment]

An X-ray detection plate according to a second embodiment of the invention was fabricated which had the same structure as that of the X-ray detection plate 31 of the first embodiment except that the first electrode film 12 of the X-ray detection plate 31 of the first embodiment was changed from an ITO thin film to a gold thin film, and measurement was carried out on the same contents as measured on the X-ray detection plate 31 of the first embodiment.

[Third Embodiment]

An X-ray detection plate according to a third embodiment of the invention was fabricated which had the same structure as that of the X-ray detection plate 31 of the first embodiment except that the first electrode film 12 of the X-ray detection plate 31 of the first embodiment was changed from an ITO thin film to an aluminum thin film, and measurement was carried out on the same contents as measured on the X-ray detection plate 31 of the first embodiment.

[Fourth Embodiment]

An X-ray detection plate according to a fourth embodiment of the invention was fabricated which had the same structure as that of the X-ray detection plate 31 of the first embodiment except that the thickness of the X-ray detection layer 14 mainly consisted of amorphous selenium of the X-ray detection plate 31 of the first embodiment was changed from 500 $\mu$m to 1000 $\mu$m, and measurement was carried out on the same contents as measured on the X-ray detection plate 31 of the first embodiment.

[Fifth Embodiment]

An X-ray detection plate according to a fifth embodiment of the invention was fabricated which had the same structure as that of the X-ray detection plate 31 of the first embodiment except that the thickness of the charge transport layer 13 mainly consisted of diantimony trisulfide of the X-ray detection plate 31 of the first embodiment was changed from 3 $\mu$m to 0.01 $\mu$m, and measurement was carried out on the same contents as measured on the X-ray detection plate 31 of the first embodiment.

[Sixth Embodiment]

An X-ray detection plate according to a sixth embodiment of the invention was fabricated which had the same structure as that of the X-ray detection plate 31 of the first embodiment except that the thickness of the charge transport layer 13 mainly consisted of diantimony trisulfide of the X-ray detection plate 31 of the first embodiment was changed from 3 $\mu$m to 40 $\mu$m, and measurement was carried out on the same contents as measured on the X-ray detection plate 31 of the first embodiment.

[Seventh Embodiment]

While diantimony trisulfide was used as the material of the charge transport layer of the X-ray detection plate 31 of the first embodiment, a charge transport layer of an X-ray detection plate of a seventh embodiment was formed by a cadmium zinc telluride thin film having a thickness of 3 $\mu$m instead of diantimony trisulfide.

The X-ray detection plate of the seventh embodiment had the same structure as that of the X-ray detection plate 31 of the first embodiment except the material of the charge transport layer, and measurement was carried out on the same contents as measured on the X-ray detection plate 31 of the first embodiment.

[First Comparative Example]

An X-ray detection plate as a first comparative example was fabricated by using a substrate 11 made of glass having a first electrode film 12 consisted of ITO formed thereon, forming an X-ray detection layer 13 made of amorphous selenium directly on the surface of the first electrode film 12 without forming the charge transport layer 13 and forming a second electrode film 15 consisted of a gold thin film with a thickness of 0.2 $\mu$m on the surface of the same. The X-ray detection plate as the first comparative example had the same structure as that of the X-ray detection plate 31 of the first embodiment except that the charge transport layer 13 was not provided, and the X-ray detection plate as the first comparative example is also subjected to measurement of the same contents as measured on the X-ray detection plate 31 of the first embodiment.

[Second Comparative Example]

An X-ray detection plate as a second comparative example was fabricated which had the same structure as that of the X-ray detection plate of the first comparative example except that the first electrode film was consisted of an gold thin film instead of ITO, and measurement was carried on the same contents as measured on the X-ray detection plate 31 of the first embodiment.

[Third Comparative Example]

An X-ray detection plate as a third comparative example was fabricated which had the same structure as that of the X-ray detection plate of the first comparative example except that the first electrode film was consisted of an aluminum thin film instead of ITO, and measurement was carried on the same contents as measured on the X-ray detection plate 31 of the first embodiment.

[Fourth Comparative Example]

An X-ray detection plate as a fourth comparative example was fabricated which had the same structure as that of the first embodiment except that the charge transport layer was formed with a 3 $\mu$m thick cadmium sulfide thin film instead of diantimony trisulfide, and measurement was carried on the same contents as measured on the X-ray detection plate 31 of the first embodiment.

[Fifth Comparative Example]

An X-ray detection plate as a fifth comparative example was fabricated which had the same structure as that of the first embodiment except that the charge transport layer was formed with a 3 $\mu$m thick cerium oxide thin film instead of diantimony trisulfide, and measurement was carried on the same contents as measured on the X-ray detection plate 31 of the first embodiment.

[Evaluation 1]

As apparent from Table 1, the X-ray detection plates as the first through third comparative examples having no charge transport layer are not practical because holes from the first electrode can not be blocked and the dark current which is a sensor noise becomes very high.

The X-ray detection plate as the fourth comparative example has a charge transport layer consisted of cadmium sulfide. Since cadmium sulfide has a specific resistance of 80$\Omega$cm. It is lower than $10^6$ $\Omega$cm, and it has no function of blocking holes injected from the first electrode film, which increases the dark current.

The X-ray detection plate as the fifth comparative example has a charge transport layer consisted of cerium oxide. Cerium oxide has a specific resistance of $10^5$ $\Omega$cm and it is less than $10^6$ $\Omega$cm. Although it exhibits diode characteristics, its function of blocking holes injected from the first electrode film is weak, which increases the dark current.

Unlike the first through fifth comparative examples described above, in the case of the X-ray detection plates of the first through sixth embodiments, a diode formed at the interface between charge transport layer mainly consisted of diantimony trisulfide and the X-ray detection layer made of amorphous selenium blocks the injection of holes into the X-ray detection layer from the first electrode film and does not block holes injected into the charge transport layer from the X-ray detection layer and charges injected into the X-ray detection layer from the charge transport layer. Thus, noise components can be reduced, and response can be improved.

The seventh embodiment had preferable results although zinc telluride cadmium is used instead of diantimony trisulfide. Therefore, an X-ray detection plate according to the invention can be fabricated using substances other than diantimony trisulfide as long as the charge transport layer is a semi-insulating resistor whose specific resistance is between $10^6$ Ωcm and $10^{12}$ Ωcm inclusive and the junction between the charge transport layer and the X-ray detection layer has characteristics of a diode whose cathode is the charge transport layer side and whose anode is the X-ray detection layer side.

It was found that no reverse blocking diode is formed when the diantimony trisulfide content of the charge transport layer according to the invention is 91 weight % or less. As a result of an experiment, electrical characteristics as shown in FIG. 3 are achieved when 95 weight % or more of diantimony trisulfide is included in the charge transport layer. The purity of selenium in the an X-ray detection layer in such a case was 99.99 weight %.

Referring to impurities other than selenium in an X-ray detection layer, it has been found that As, Te, Mg, Si, Fe, Al, Cu, Ag, Cl and Na exist. As and Te do not affect electrical characteristics when their content is 10 weight % or less. Referring to selenium for forming an X-ray detection layer, selenium with high purity may be used as a deposition source. Alternatively, an amorphous X-ray detection layer including tellurium or an X-ray detection layer including arsenic may be provided by using an alloy of selenium and tellurium or an alloy of selenium and arsenic as a deposition source and selenium as a main component. Referring to other impurities in an X-ray detection layer, it is assumed that they do not affect electrical characteristics if the content is 1 weight % or less.

[Eighth Embodiment]

A two-dimensional X-ray detector as shown in FIGS. 8 and 9 was fabricated, and the spatial frequency characteristics or MTF (modulation transfer function) that serve as an index of resolution was measured. ITO was used as the first electrode film; diantimony trisulfide with a thickness of 3.0 μm was used as the charge transport layer; amorphous selenium with a thickness of 500 μm was used as the X-ray detection layer; and gold was used as the second electrode layer. The pixel size of the two-dimensional X-ray detector was 150 μm. MTF was measured using lead slits with slits width in the range from 10 μm to 20 μm, and the data was measured with the slits inclined relative to the direction of the columns of the two-dimensional X-ray detector at an angle in the range from about 1° to 2°.

[Sixth Comparative Example]

A two-dimensional X-ray detector was fabricated which had the same structure as that of the eighth embodiment except that the thickness of diantimony trisulfide was 0.07 μm, and MTF of the same was measured.

[Evaluation 2]

Figure 11:
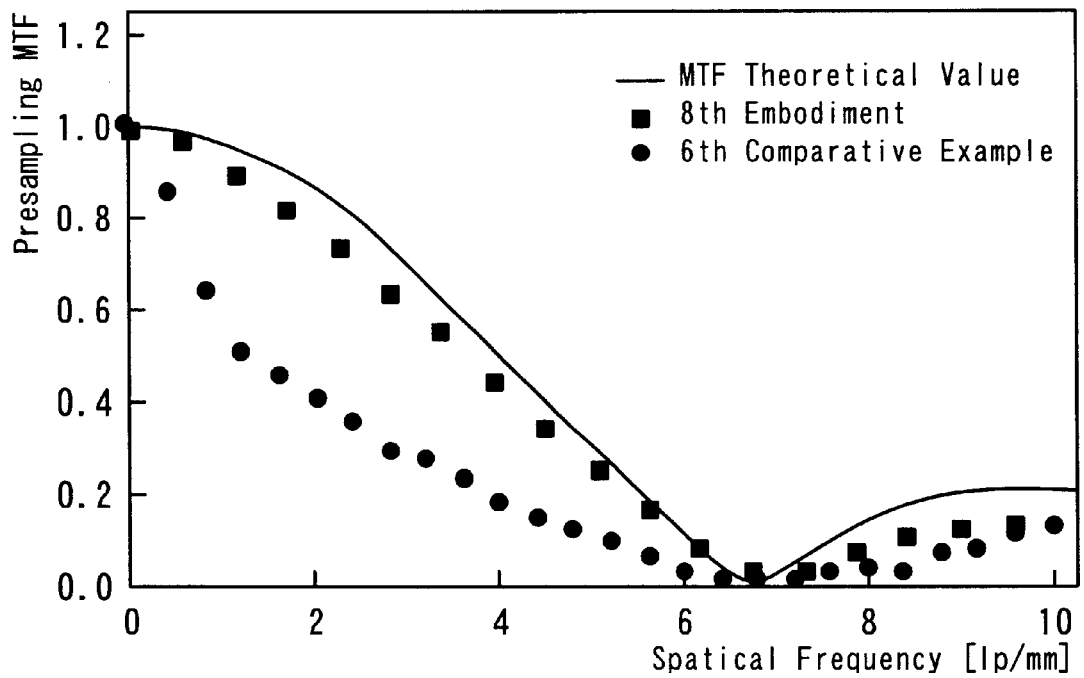
FIG. 11 shows an example of measurement of MTF of the two-dimensional X-ray detector according to the invention and a comparative example.

As shown in FIG. 11, the MTF of the sample as the eighth embodiment is close to a theoretical value, which indicates that there is no reduction in resolution. On the contrary, the MTF of the sample as the sixth comparative example is much smaller than a theoretical value, which indicates that there is a reduction in resolution.

When two-dimensional X-ray detectors similar to the eighth embodiment are fabricated using the structures shown in the fourth and fifth comparative examples and X-ray images are obtained, the resultant images have unclear contrast and include after-images, which indicates that no clear images can not be obtained.

As described above, when the second electrode film of an X-ray detection plate according to the invention is irradiated with an X-ray, the X-ray is transmitted by the second electrode film to enter the X-ray detection layer mainly consisted of amorphous selenium, and carriers which are pairs of electrons and holes are generated in the X-ray detection layer by the energy of the X-ray.

In this case, when the X-ray is radiated with voltages applied between the first and second electrode films, each of the carriers generated in the X-ray detection layer is moved by the electrical fields and collected by the first and second electrode films.

Referring to the polarities of the voltages applied between the first and second electrode films, when the voltage applied to the second electrode film is lower than the voltage applied to the first electrode film, electrons are collected by the first electrode film and holes are collected by the second electrode film by the action of the electrical fields. In the X-ray detection plate according to the invention, a charge transport layer formed with a semi-insulating resistor is provided between the first electrode film at the positive voltage and the X-ray detection layer at the negative voltage.

This charge transport layer is in contact with the x-ray detection layer mainly consisting of amorphous selenium, and a diode whose anode side is the x-ray detection layer side and whose cathode is the charge transport layer side. This diode is formed between the X-ray detection layer and the charge transport layer caused by the physical property of the charge transport layer.

Since a diode have rectification characteristics, holes are prevented from being injected into the X-ray detection layer by the diode even when the holes are injected into the charge transport layer from the first electrode film. As a result, the dark current that acts as dark noises can be reduced by two digits without reducing the mobility and the life of carriers.

The diode does not hinder the movement of holes generated in the X-ray detection layer to the second electrode film. Further, it does not hinder the movement of electrons from the first electrode film into the charge transport layer. Therefore, only noise components are reduced, and the life after repeated use and response can be improved to improve the sensitivity of the X-ray detector consequently.

When the charge transport layer of an X-ray detector according to the invention is semi-insulating, there is a significant advantage in that the dispersion of carriers which have entered the charge transport layer can be prevented to prevent any reduction of resolution.

It has been empirically revealed that the semi-insulating charge transport layer must have a thickness of 0.01 μm or more as a lower limit, and the upper limit of the thickness is 50 μm for reasons including peeling of the film. Further, a thickness in the range from 0.1 μm to 5 μm inclusive is especially preferable because it will provide excellent spatial frequency characteristics.

An X-ray detection plate according to the invention and an X-ray detector utilizing the X-ray detection plate will allow an X-ray to be detected with a high signal-to-noise ratio.

A two-dimensional X-ray detector according to the invention is advantageous as a two-dimensional X-ray photographic apparatus that serves various industrial purposes beside medical applications because it provides images of high quality with high resolution.

What is claimed is:

1. An X-ray detection plate comprising:

an insulating substrate;

a first electrode film formed on the substrate;

a charge transport layer formed on the first electrode film;

an X-ray detection layer mainly consisted of amorphous selenium and formed in contact with the charge transport layer; and a second electrode film formed on the X-ray detection layer, wherein the charge transport layer is a semi-insulating resistive element having specific resistance between $10^6$ Ωcm and $10^{12}$ Ωcm inclusive, and the junction between the charge transport layer and the X-ray detection layer having characteristics of a diode whose cathode is the charge transport layer side and whose anode is the X-ray detection layer side.

2. An X-ray detection plate according to claim 1, wherein the thickness of the charge transport layer is between 0.01 μm and 50 μm inclusive and the selenium content of the X-ray detection layer is 90 weight % or more.

3. An X-ray detection plate according to claim 1, wherein the charge transport layer is a semi-insulating resistive element mainly consisted of diantimony trisulfide.

4. An X-ray detection plate according to claim 1, wherein the second electrode film is a metal film mainly consisted of gold.

5. An X-ray detection plate according to claim 1, wherein the first electrode film have transparency.

6. An X-ray detection plate according to claim 5, wherein the first electrode film is an ITO (indium tin oxide) film.

7. An X-ray detection plate according to claim 5, wherein the substrate have transparency.

8. An X-ray detection plate comprising:

an insulating substrate;

a plurality of charge storage elements formed on the insulating substrate;

a plurality of first electrode films formed on the plurality of charge storage elements and electrically connected to the plurality of charge storage elements respectively;

a charge transport layer formed on the first electrode films;

an X-ray detection layer mainly consisting of amorphous selenium and formed in contact with the charge transport layer;

a second electrode film formed on the X-ray detection layer; and a means for sequentially reading charge signals stored in the plurality of charge storage elements according to a time series, wherein the charge transport layer is a semi-insulating resistive element having specific resistance between $10^6$ Ωcm and $10^{12}$ Ωcm inclusive.

9. An X-ray detection plate according to claim 8, wherein the junction between the charge transport layer and the X-ray detection layer has characteristics of a diode whose cathode is the charge transport layer side and whose anode is the X-ray detection layer side.

10. An X-ray detection plate according to claim 9, wherein the thickness of the charge transport layer is between 0.01 μm and 50 μm inclusive and wherein the selenium content of the X-ray detection layer is 90 weight % or more.

11. An X-ray detection plate according to claim 8, wherein the thickness of the charge transport layer is between 0.01 μm and 50 μm inclusive and wherein the selenium content of the X-ray detection layer is 90 weight % or more.

12. An X-ray detection plate according to claim 8, wherein the charge transport layer is a semi-insulating resistive element mainly consisted of diantimony trisulfide.

13. An X-ray detection plate according to claim 8, wherein the second electrode film is a metal film mainly consisted of gold.

14. An X-ray detection plate according to claim 8, wherein the first electrode film have transparency.

15. An X-ray detection plate according to claim 14, wherein the first electrode film is an ITO (indium tin oxide) film.

16. An X-ray detection plate according to claim 14, wherein the substrate have transparency.

17. An X-ray detector having an X-ray detection plate, a power supply and an X-ray irradiator, wherein the power supply supplies a voltage to the X-ray detection plate and the X-ray irradiator is caused to emit an X-ray such that the X-ray detection plate is irradiated with the X-ray which has been transmitted by an object to be measured to form an image on the X-ray detection plate, the X-ray detection comprising:

an insulating substrate;

a first electrode film formed on the substrate;

a charge transport layer formed on the first electrode film;

an X-ray detection layer mainly consisted of amorphous selenium and formed in contact with the charge transport layer; and a second electrode film formed on the X-ray detection layer, wherein the charge transport layer is a semi-insulating resistive element having specific resistance between $10^6$ Ωcm and $10^{12}$ Ωcm inclusive, the junction between the charge transport layer and the X-ray detection layer having characteristics of a diode whose cathode is the charge transport layer side and whose anode is the X-ray detection layer side, and the power supply applying a voltage to the second electrode film during the irradiation with the X-ray, the voltage being lower than the voltage applied to the first electrode film.

18. An X-ray detector according to claim 17, further comprising a display device for displaying the image formed on the X-ray detection plate.

19. An X-ray detector having an X-ray detection plate, a power supply and an X-ray irradiator, wherein the X-ray irradiator is caused to emit an X-ray such that the x-ray detection plate is irradiated with the x-ray which has been transmitted by an object to be measured to form an image on the X-ray detection plate while a voltage is applied to the X-ray detection plate by the power supply, the X-ray detection plate comprising:

an insulating substrate;

a plurality of charge storage elements formed on the insulating substrate;

a plurality of first electrode films formed on the plurality of charge storage elements and electrically connected to the plurality of charge storage elements respectively;

a charge transport layer formed on the first electrode films;

an X-ray detection layer mainly consisted of amorphous selenium and formed in contact with the charge transport layer;

a second electrode film formed on the X-ray detection layer; and a means for sequentially reading charge signals stored in the plurality of charge storage elements according to a time series wherein the charge transport layer is a semi-insulating resistive element having specific resistance between $10^6$ Ωcm and $10^{12}$ Ωcm inclusive, and the power supply applying a voltage to the second electrode film during the irradiation with the X-ray, the voltage being lower than the voltage applied to the first electrode films.

20. An X-ray detector according to claim 18, further comprising a display device for displaying the image formed on the X-ray detection plate.

* * * * *